(12) United States Patent
Gao et al.

(10) Patent No.: US 11,716,812 B2
(45) Date of Patent: Aug. 1, 2023

(54) MILLIMETER-WAVE ACTIVE ANTENNA UNIT, AND INTERCONNECTION STRUCTURE BETWEEN PCB BOARDS

(71) Applicant: Comba Network Systems Company Limited, Guangdong (CN)

(72) Inventors: Yongzhen Gao, Guangzhou (CN); Shangkun Wu, Guangzhou (CN); Zhimei Zhang, Guangzhou (CN); Xia Gao, Guangzhou (CN); Weidong Zhong, Guangzhou (CN)

(73) Assignee: Comba Network Systems Company Limited

( * ) Notice: Subject to any disclaimer, the term of this patent is extended or adjusted under 35 U.S.C. 154(b) by 0 days.

(21) Appl. No.: 17/622,036

(22) PCT Filed: Dec. 11, 2019

(86) PCT No.: PCT/CN2019/124663
§ 371 (c)(1),
(2) Date: Dec. 22, 2021

(87) PCT Pub. No.: WO2020/258743
PCT Pub. Date: Dec. 30, 2020

(65) Prior Publication Data
US 2022/0256702 A1 Aug. 11, 2022

(30) Foreign Application Priority Data
Jun. 26, 2019 (CN) .......................... 201910559953.4

(51) Int. Cl.
*H01Q 5/335* (2015.01)
*H05K 1/14* (2006.01)
(Continued)

(52) U.S. Cl.
CPC ............ *H05K 1/141* (2013.01); *H01Q 1/424* (2013.01); *H01Q 5/335* (2015.01); *H01Q 13/08* (2013.01); *H05K 1/117* (2013.01)

(58) Field of Classification Search
CPC ........ H05K 1/141; H05K 1/117; H01Q 5/335; H01Q 1/424; H01Q 13/08
(Continued)

(56) References Cited

U.S. PATENT DOCUMENTS

| 6,476,767 B2 | 11/2002 | Aoyama et al. |
| 2005/0190614 A1* | 9/2005 | Brunette ............. H05K 1/0251 365/192 |

(Continued)

FOREIGN PATENT DOCUMENTS

| CN | 105764250 A | 7/2016 |
| CN | 107872919 A | 4/2018 |

(Continued)

OTHER PUBLICATIONS

International Search Report for Application No. PCT/CN2019/124663 dated Mar. 26, 2020, pp. 1-3.

(Continued)

*Primary Examiner* — Andargie M Aychillhum
(74) *Attorney, Agent, or Firm* — Lerner David LLP

(57) ABSTRACT

A millimeter-wave active antenna unit and an interconnection structure between PCBs is provided. The interconnection structure between PCBs comprises a mainboard and an AIP antenna module. The mainboard is a first multilayer PCB on which a signal transmission line and a first pad electrically connected to the signal transmission line are provided. The AIP antenna module is a second multilayer PCB on which a second pad, an impedance matching transformation branch, an impedance line and a signal processing circuit are provided. The mainboard and the AIP antenna module are interconnected by directly welding multiple PCBs.

15 Claims, 4 Drawing Sheets

(51) Int. Cl.
  *H01Q 1/42* (2006.01)
  *H01Q 13/08* (2006.01)
  *H05K 1/11* (2006.01)

(58) Field of Classification Search
  USPC ........................................................ 361/803
  See application file for complete search history.

(56) References Cited

U.S. PATENT DOCUMENTS

| | | | |
|---|---|---|---|
| 2009/0078458 A1* | 3/2009 | Araumi | H05K 3/4664 |
| | | | 174/262 |
| 2014/0085856 A1* | 3/2014 | Shirao | H01P 3/003 |
| | | | 174/254 |
| 2015/0061924 A1 | 3/2015 | Binzer et al. | |
| 2016/0252887 A1* | 9/2016 | Namiki | G04G 17/04 |
| | | | 368/10 |

FOREIGN PATENT DOCUMENTS

| | | |
|---|---|---|
| CN | 107949154 A | 4/2018 |
| CN | 207854262 U | 9/2018 |
| CN | 110167261 A | 8/2019 |
| EP | 2348578 A1 | 7/2011 |
| WO | 2008111914 A1 | 9/2008 |

OTHER PUBLICATIONS

Yueping, Z., "Recent Advances in Antenna-in-Package Technology," ZTE Technology Journal, Oct. 2018, pp. 47-53. (Providing English Translation of Abstract only).

Zhang Tao et al: "Low-Cost Aperture-Coupled 60-GHz-Phased Array Antenna Package with Compact Matching Network", IEEE Transactions on Antennas and Propagation, IEEE, USA, vol. 65, No. 12, Nov. 30, 2017 (Nov. 30, 2017), pp. 6355-6362, XP011673558.

Extended European Search Report for Application No. 19934631.3 dated Jul. 15, 2022. 8 pgs.

* cited by examiner

MILLIMETER-WAVE ACTIVE ANTENNA UNIT, AND INTERCONNECTION STRUCTURE BETWEEN PCB BOARDS

CROSS-REFERENCE TO RELATED APPLICATION

This application is a national stage application, filed under 35 U.S.C. § 371, of International Patent Application No. PCT/CN2019/124663, filed on Dec. 11, 2019, which claims priority from Chinese Application No. 201910559953.4, filed Jun. 26, 2019, all of which is incorporated by reference herein in its entirety.

TECHNICAL FIELD

The present application relates to the technical field of millimeter wave communication, and in particular to a millimeter-wave active antenna unit and an interconnection structure between PCBs.

BACKGROUND

With the development of the 5G communication technology, millimeter waves have significant advantages in large-bandwidth and high-speed communication. Sub-6 GHz and millimeter wave frequency bands need to cooperate and be complementary with each other to better realize the 5G system. 5G millimeter waves can be widely applied in small base stations, customer premise equipments (CPEs), Repeaters and other scenarios. The millimeter-wave active antenna unit (AAU) product includes an antenna in package (AIP) antenna module and a mainboard connected to the AIP antenna module. The antenna radiation unit of the AIP antenna module is located on the surface layer of the multilayer PCB (multiple layers means no less than two layers), and the interconnection millimeter-wave signal line between the AIP antenna module and the mainboard is located on the bottom of the multilayer PCB to realize the interconnection between the AIP antenna module and the mainboard. However, for conventional AIP antenna modules, the interconnection design between boards is generally realized by BGA ball planting, so the cost is high. Or, the millimeter-wave AAU products are obtained by a PCB welding process. In this case, although the cost is low, it is suitable for scenarios with low frequency and less stack layers.

SUMMARY

On this basis, it is necessary to overcome the deficiencies of the prior art and provide a millimeter-wave active antenna unit and an interconnection structure between PCBs, which can realize low cost and can be suitable for a wider range of frequencies and a wider range of stack layers.

The technical solutions will be described below. An interconnection structure between PCBs is provided, including: a first multilayer PCB, on which a signal transmission line and a first pad electrically connected to the signal transmission line being provided; and, a second multilayer PCB, on which a second pad, an impedance matching transformation branch, an impedance line and a signal processing circuit being provided, the second pad and the first pad being superposed and connected by welding, the second pad being electrically connected to the impedance line through the impedance matching transformation branch, the impedance line being electrically connected to the signal processing circuit. The interconnection structure between PCBs includes: a mainboard which is a first multilayer PCB, a signal transmission line and a first pad electrically connected to the signal transmission line being provided on the first multilayer PCB; and, an AIP antenna module which is a second multilayer PCB, a second pad, an impedance matching transformation branch, an impedance line and a signal processing circuit being provided on the second multilayer PCB, the second pad and the first pad being superposed and connected by welding, the second pad being electrically connected to the impedance line through the impedance matching transformation branch, the impedance line being electrically connected to the signal processing circuit. The signal processing circuit can be specifically a power divider processing circuit or other millimeter-wave processing circuits. In addition, the signal transmission line is specifically a ground-coplanar waveguide (GCPW) transmission line, a microstrip line or other types of transmission lines.

In the interconnection structure between PCBs, the mainboard and the AIP antenna module are interconnected by directly welding multilayer PCBs. Thus, on one hand, expensive millimeter-wave interconnection components (e.g., axes, waveguides, etc.) are omitted, so that the cost is very low. On the other hand, by directly welding boards, the reliability of the product is improved, the interconnection design between multilayer PCBs can be realized, the integration between multilayer PCBs is greatly improved, and it is advantageous for the miniaturization of millimeter-wave devices. In addition, the impedance matching transformation branch and the impedance line are provided between the second pad and the signal processing circuit, and the specific design size of the impedance matching transformation branch and the impedance line can be correspondingly simulated and designed according to the specific working frequency, so that it can be suitable for a wider range of frequencies and a wider range of stack layers.

A millimeter-wave active antenna unit is provided, including the interconnection structure between PCBs as described above.

Since the millimeter-wave active antenna unit includes the interconnection structure between PCBs as described above, the technical effects of the millimeter-wave active antenna unit are brought by the interconnection structure between PCBs, and the millimeter-wave active antenna unit has the same beneficial effects as the interconnection structure between PCBs and they will not be repeated here.

DETAILED DESCRIPTION

To make the objects, features and advantages of the present application more obvious and comprehensible, the specific implementations of the present application will be described in detail below with reference to the drawings. Numerous specific details are set forth in the following description to fully understand the present application. However, the present application can be implemented in many other ways different from those described herein, and those skilled in the art can make similar improvements without departing from the principles of the present application, so the present application is not limited by the specific embodiments disclosed below.

Figure 1:
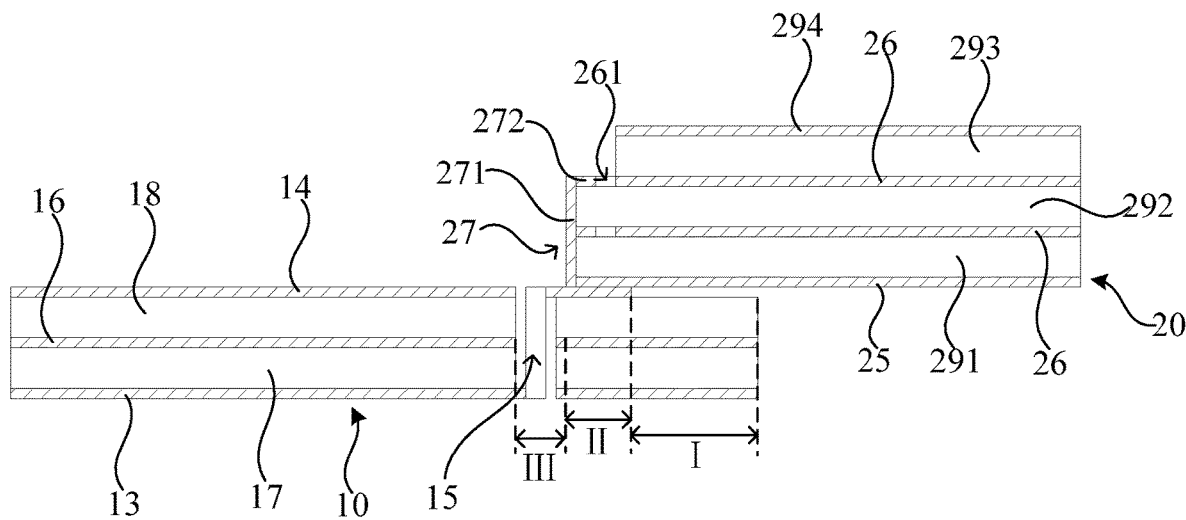
FIG. 1 is a schematic structure diagram of an interconnection structure between PCB s according to an embodiment of the present application.
Figure 4:
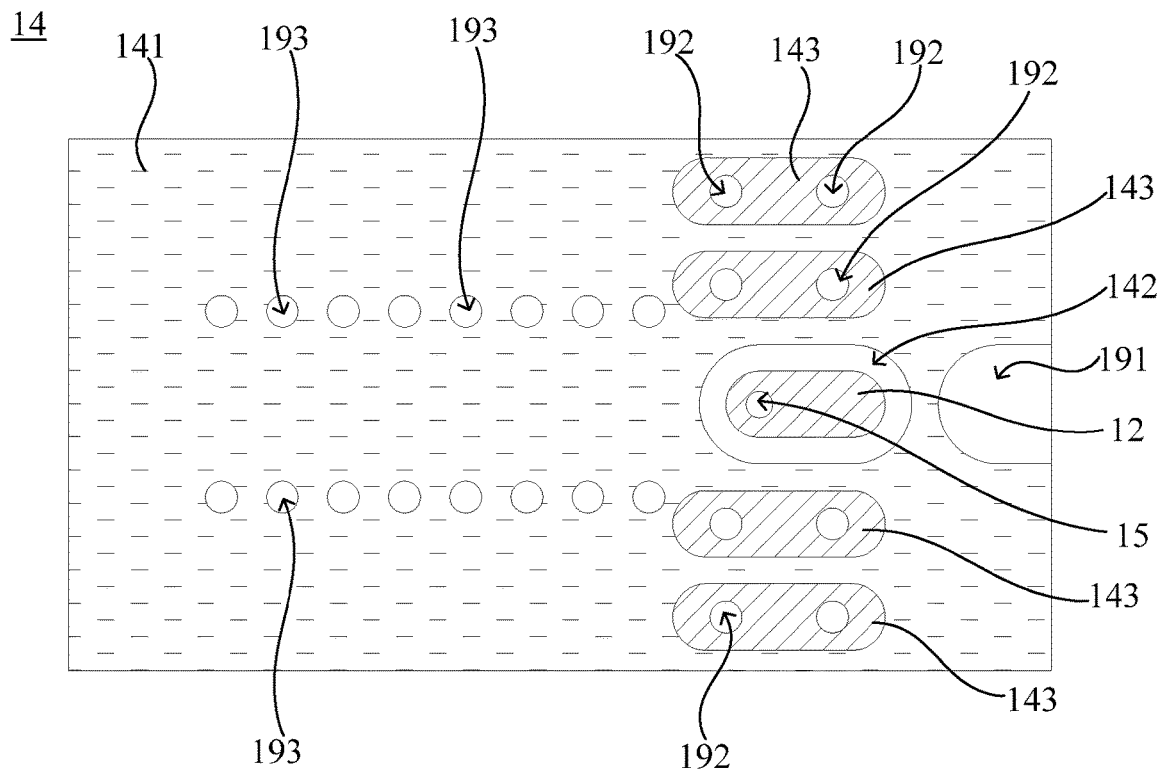
FIG. 4 is a structure diagram of a top circuit layer of the mainboard in the interconnection structure between PCB s according to an embodiment of the present application.
Figure 5:
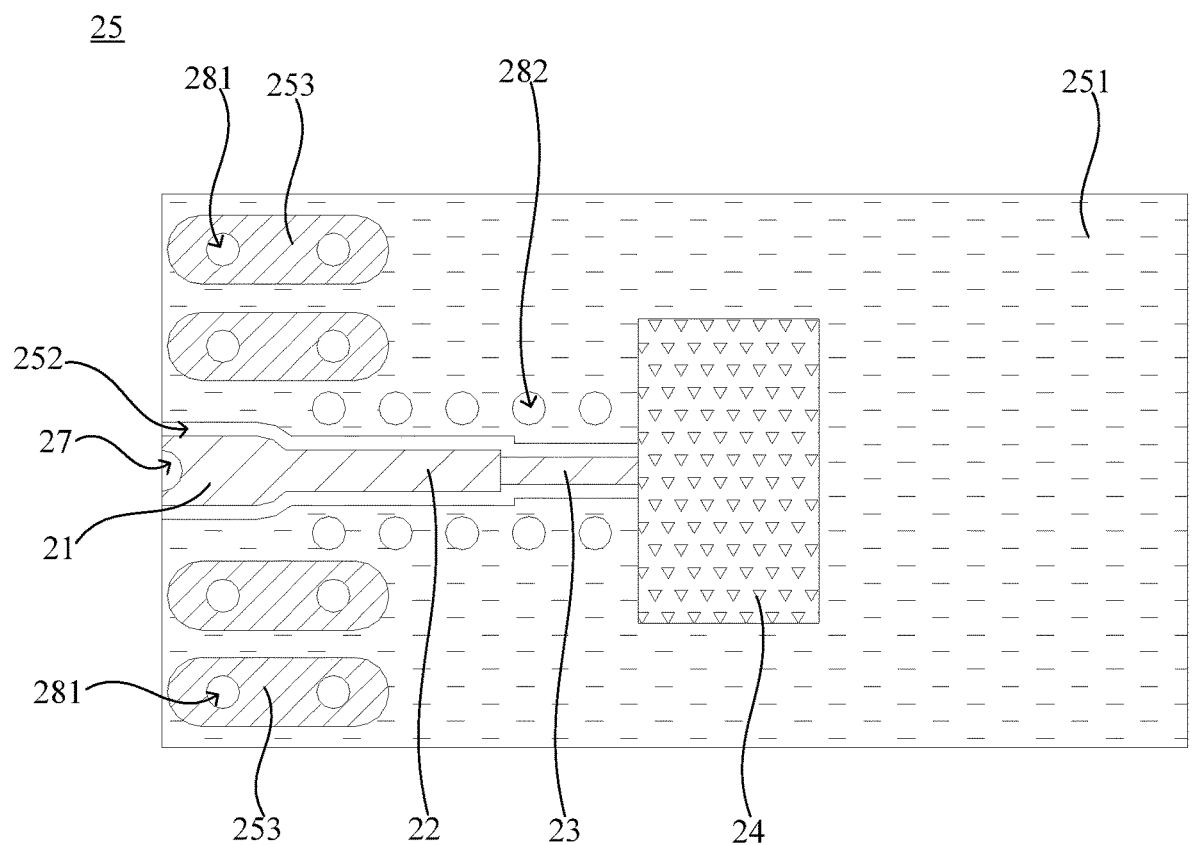
FIG. 5 is a structure diagram of a bottom circuit layer of an AIP antenna module in the interconnection structure between PCBs according to an embodiment of the present application.

In an embodiment, with reference to FIGS. 1, 4 and 5, an interconnection structure between PCBs is provided, including a mainboard and an AIP antenna module. The mainboard is a first multilayer PCB 10, and a signal transmission line 11 and a first pad 12 electrically connected to the signal transmission line 11 are provided on the first multilayer PCB 10. The AIP antenna module is a second multilayer PCB 20, and a second pad 21, an impedance matching transformation branch 22, an impedance line 23 and a signal processing circuit 24 are provided on the second multilayer PCB 20. The second pad 21 and the first pad 12 are superposed and connected by welding, and the second pad 21 is electrically connected to the impedance line 23 through the impedance matching transformation branch 22. The impedance line 23 is electrically connected to the signal processing circuit 24. The signal processing circuit 24 can be specifically a power divider processing circuit or other millimeter-wave processing circuits. In addition, the signal transmission line 11 is specifically a ground-coplanar waveguide (GCPW) transmission line, a microstrip line or other types of transmission lines.

In the interconnection structure between PCBs, the mainboard and the AIP antenna module are interconnected by directly welding multilayer PCBs. Thus, on one hand, expensive millimeter-wave interconnection components (e.g., axes, waveguides, etc.) are omitted, so that the cost is very low. On the other hand, by directly welding boards, the reliability of the product is improved, the interconnection design between multilayer PCBs can be realized, the integration between multilayer PCBs is greatly improved, and it is advantageous for the miniaturization of millimeter-wave devices. In addition, the impedance matching transformation branch 22 and the impedance line 23 are provided between the second pad 21 and the signal processing circuit 24, and the specific design size of the impedance matching transformation branch 22 and the impedance line 23 can be correspondingly simulated and designed according to the specific working frequency, so that it can be suitable for a wider range of frequencies and a wider range of stack layers.

Further, with reference to FIGS. 1-4, the signal transmission line 11 and the first pad 12 are located on a bottom circuit layer 13 and a top circuit layer 14 of the first multilayer PCB 10, respectively. A first signal hole 15 running from the first pad 12 to the signal transmission line 11 is defined on the first multilayer PCB 10. The signal transmission line 11 is electrically connected to the first pad 12 through a conductive layer on a sidewall of the first signal hole 15. Thus, the signal transmission line 11 on the bottom circuit layer 13 of the first multilayer PCB 10 can be electrically connected to the first pad 12 on the top circuit layer 14 through the first signal hole 15 and then electrically connected to the second pad 21 on the second multilayer PCB 20 from the first pad 12, so that signals are transmitted to the signal processing circuit 24. That is, the signal transmission in different planes can be realized, the interconnection design between multilayer PCBs can be realized, and the stability and processability can be greatly improved.

Figure 2:
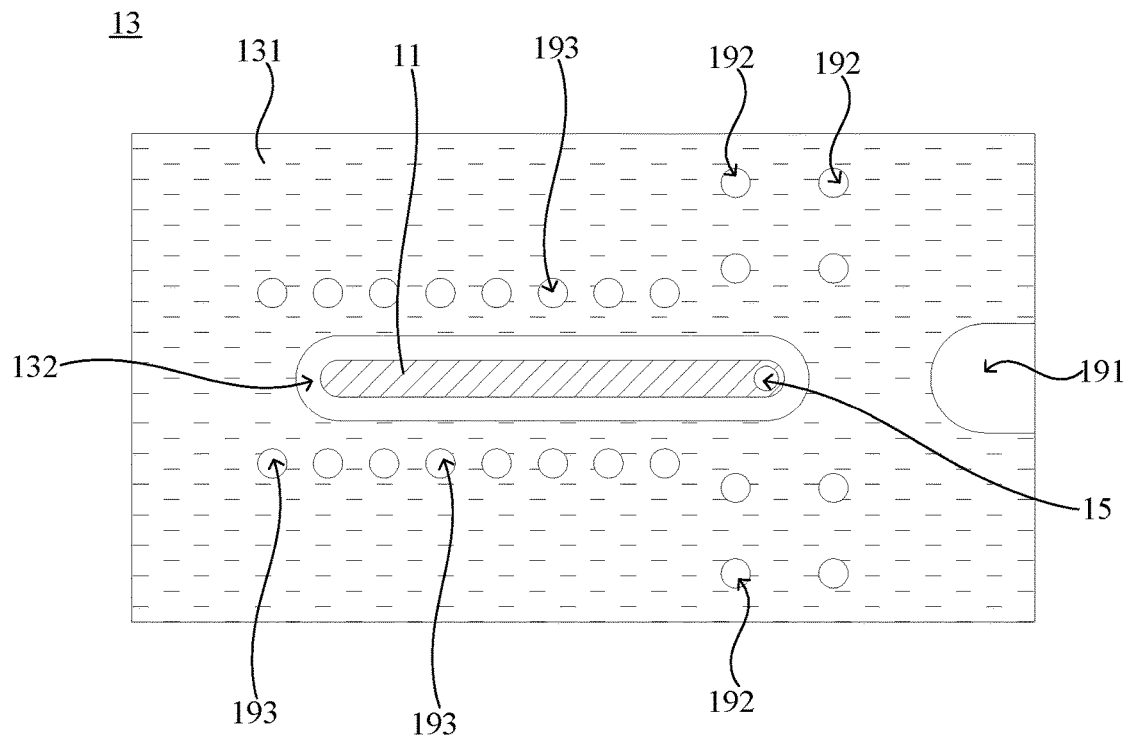
FIG. 2 is a structure diagram of a bottom circuit layer of a mainboard in the interconnection structure between PCB s according to an embodiment of the present application.

In an embodiment, with reference to FIGS. 1 and 2, the bottom circuit layer 13 of the first multilayer PCB 10 includes a first grounding conductive layer 131. A first gap region 132 is provided in the first grounding conductive layer 131, the signal transmission line 11 is located within the first gap region 132, and an outer edge of the signal transmission line 11 is spaced apart from an inner edge of the first gap region 132. Thus, the first grounding conductive layer 131 wraps the signal transmission line 11, so that the high order mode transmission of the signal transmission line 11 can be effectively avoided, and the performance of the signal transmission line 11 can thus be improved. In addition, the occurrence of short circuit caused by the electrical connection of the signal transmission line 11 to the first grounding conductive layer 131 can also be avoided. The distance between the outer edge of the signal transmission line 11 and the inner edge of the first gap region 132 can be determined according to the design rules for the signal transmission line 11 (microstrip line or GCPW transmission line), and will not be repeated here.

In an embodiment, with reference to FIGS. 1 and 4, the top circuit layer 14 of the first multilayer PCB 10 includes a second grounding conductive layer 141. A second gap region 142 is provided in the second grounding conductive layer 141, the first pad 12 is located within the second gap region 142, and an outer edge of the first pad 12 is spaced apart from an inner edge of the second gap region 142. Thus, similarly, the second grounding conductive layer 141 wraps the first pad 12, so that the occurrence of short circuit caused by the electrical connection of the first pad 12 to the second grounding conductive layer 141 can be avoided. The distance between the outer edge of the first pad 12 and the inner edge of the second gap region 142 can be determined according to the electromagnetic simulation and processing requirements, and generally has a value of 0.2 mm.

In an embodiment, with reference to FIGS. 1 and 5, the bottom circuit layer 25 of the second multilayer PCB 20 includes a third grounding conductive layer 251, and a third gap region 252 is provided in the third grounding conductive layer 251. The second pad 21, the impedance matching transformation branch 22 and the impedance line 23 are all located within the third gap region 252, and outer edges of the second pad 21, the impedance matching transformation branch 22 and the impedance line 23 are spaced apart from an inner edge of the third gap region 252 respectively. Thus, similarly, the third grounding conductive layer 251 wraps the second pad 21, the impedance matching transformation branch 22 and the impedance line 23 respectively, so that the high order mode transmission of the impedance matching transformation branch 22 and the impedance line 23 can be effectively avoided, and the performance of the impedance matching transformation branch 22 and the impedance line 23 can thus be improved. In addition, the occurrence of short circuit caused by the electrical connection of the impedance matching transformation branch 22 and the impedance line 23 to the third grounding conductive layer 251 can also be avoided. The distances between the outer edges of the impedance matching transformation branch 22 and the impedance line 23 and the inner edge of the third gap region 252 can be determined according to the design rules for the impedance matching transformation branch 22 and the impedance line 23 (microstrip line or GCPW transmission line) and will not be repeated here.

Figure 3:
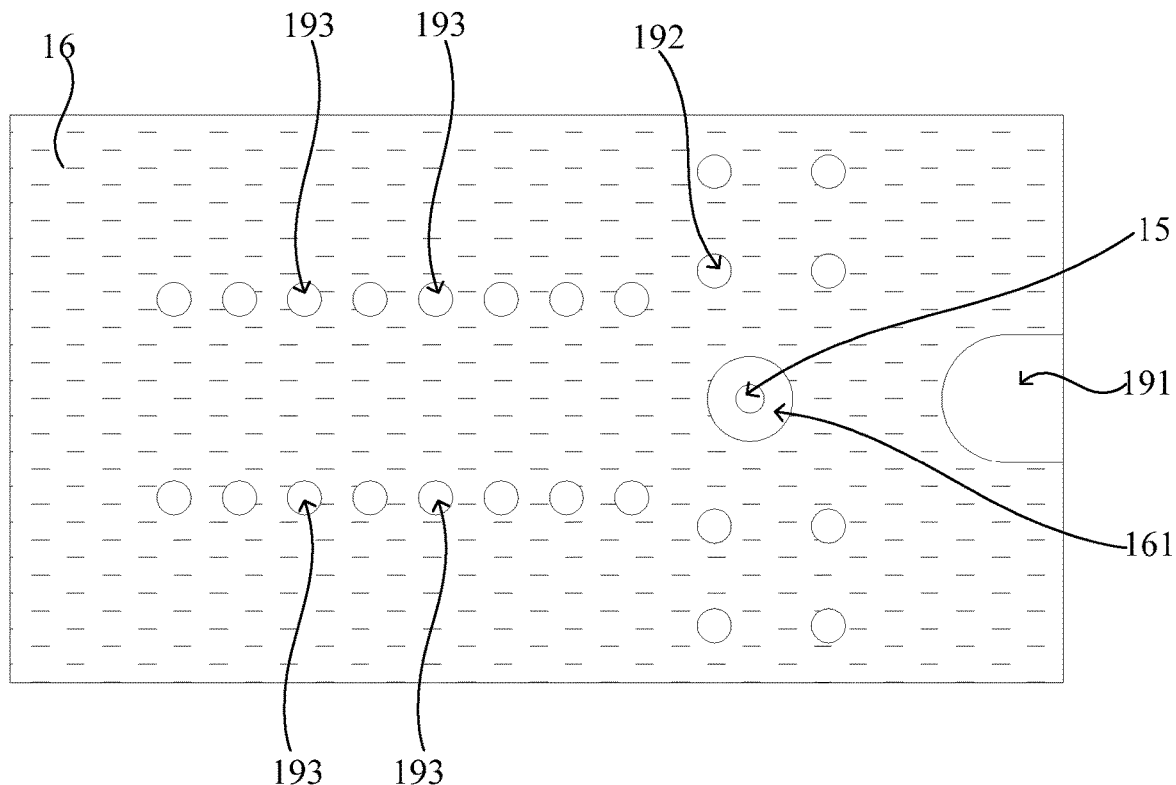
FIG. 3 is a structure diagram of an inner circuit layer of the mainboard in the interconnection structure between PCB s according to an embodiment of the present application.

Further, with reference to FIGS. 1 and 3, the multilayer PCB 10 further includes one or more inner circuit layers 16 arranged between the bottom circuit layer 13 and the top circuit layer 14 of the first multilayer PCB 10. A first anti-pad gap region 161 around the first signal hole 15 is provided in the inner circuit layer 16 of the first multilayer PCB 10. Thus, the first anti-pad gap region 161 isolates the conductive layer on the sidewall of the first signal hole 15 from the inner circuit layer 16, thereby avoiding the occurrence of short circuit. Specifically, there may be one, two, three or four inner circuit layers 16, without limitations.

Further, with reference to FIG. 1, the first multilayer PCB 10 further includes a first dielectric layer 17 arranged between the bottom circuit layer 13 and the inner circuit layer 16 of the first multilayer PCB 10 and a second dielectric layer 18 arranged between the top circuit layer 14 and the inner circuit layer 16 of the first multilayer PCB 10. The first dielectric layer 17 is a high-frequency dielectric layer, and the second dielectric layer 18 is an RF4 dielectric layer. The high-frequency dielectric layer can be specifically Rogers4350, Rogers5880 or the like, and the second dielectric layer 18 is made of a less-expensive RF4 plate. The layers are superposed by a mixed pressure stacking process, so that the material cost for the first multilayer PCB 10 can be reduced.

Further, with reference to FIG. 1, a partial region of the first multilayer PCB 10 is superposed with a partial region of the second multilayer PCB 20 to form a superposed region, and the superposed region of the first multilayer PCB 10 overlapped with the second multilayer PCB 20 includes a first superposed region I and a second superposed region II connected to the first superposed region. The first superposed region is closer to the edge of the first multilayer PCB 10 than the second superposed region. The first pad 12 is located within the second superposed region, and the second pad 21 is located at an end of the second multilayer PCB 20 and arranged corresponding to the second superposed region. A hollow gap 191 is formed at a position of the first superposed region corresponding to the impedance matching transformation branch 22. Specifically, the hollow gap 191 is a groove dug vertically on the first multilayer PCB 10 from the top down within the first superposed region on the basis of the width of the impedance matching transformation branch 22. This groove runs through the first multilayer PCB 10, so that the second dielectric layer 18 is prevented from adversely affecting the signal on the signal line of the second multilayer PCB 20 (e.g., increasing standing waves, increasing the insertion loss or other deficiencies).

Further, the first multilayer PCB 10 further includes a third superposed region III connected to the second superposed region. A part of the first pad 12 is located in the second superposed region, and the other part of the first pad 12 is located in the third superposed region. Thus, during the operation of welding the first pad 12 and the second pad 21, solder tin can be placed in the part of the first pad 12 corresponding to the third superposed region, so that the welding performance between the first pad 12 and the second pad 21 is improved. In addition, the part of the first pad 12 corresponding to the second superposed region is superposed and welded with the second pad 21, so that the reliability of signal connection can be ensured.

Further, with reference to FIGS. 1-4, an auxiliary welding hole 27 corresponding to the position of the second pad 21 is formed at an end of the second multilayer PCB 20. The auxiliary welding hole 27 runs from the top layer of the second multilayer PCB 20 to the second pad 21, and an auxiliary welding conductive layer 271 is provided on a sidewall of the auxiliary welding hole 27. Thus, solder tin can be placed on the sidewall of the auxiliary welding hole 27, so that the welding performance between the first pad 12 and the second pad 21 is improved, it is advantageous to superpose and weld the part of the first pad 12 corresponding to the second superposed region with the second pad 21, and the reliability of signal connection can be ensured. Specifically, the auxiliary welding hole 27 is a semicircular auxiliary welding hole. In design, the semicircular auxiliary welding hole is formed by a back drilling or sinking process. In the case of satisfying the weldability, the height of the auxiliary welding conductive layer 271 on the sidewall of the auxiliary welding hole 27 is as small as possible (that is, the branch length is as small as possible), thereby avoiding adverse effects on millimeter wave signals.

Figure 6:
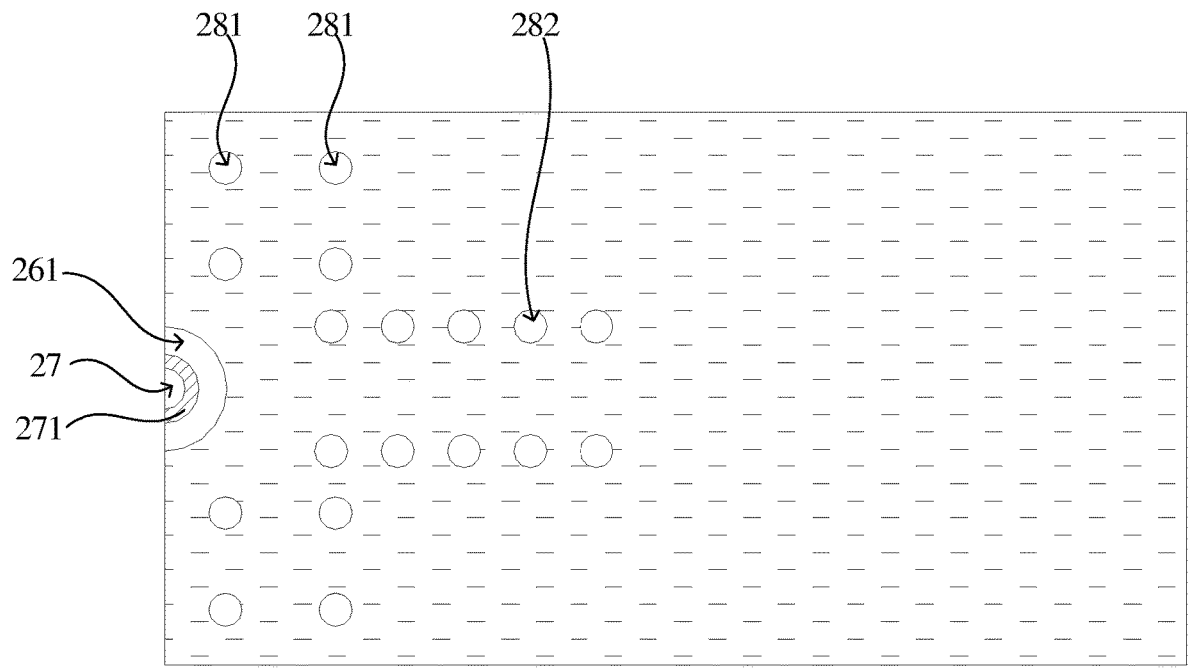
FIG. 6 is a structure diagram of an inner circuit layer of the AIP antenna module in the interconnection structure between PCBs according to an embodiment of the present application.

In an embodiment, with reference to FIGS. 1, 5 and 6, an inner circuit layer 26 is provided in the second multilayer PCB 20, a second anti-pad gap region 261 around the auxiliary welding hole 27 is provided in the inner circuit layer 26 of the second multilayer PCB 20, and an auxiliary pad 272 electrically connected to the auxiliary welding conductive layer 271 is provided in the second anti-pad gap region 261. Thus, the second anti-pad gap region 261 isolates the auxiliary welding conductive layer 271 on the sidewall of the auxiliary welding hole 27 from the inner circuit layer 26, thereby avoiding the occurrence of short circuit. In addition, an auxiliary pad 272 is additionally provided in the second anti-pad gap region 261 of the inner circuit layer 26 of the second multilayer PCB 20, mainly to improve the interconnection reliability of the semicircular auxiliary welding hole arranged vertically.

Specifically, there may be one, two, three or four inner circuit layers 26 on the second multilayer PCB 20, without limitations.

In an embodiment, with reference to FIGS. 4 and 5, first ground pads 143 are further provided on the first multilayer PCB 10, and the first ground pads 143 are laid on the second grounding conductive layer 141. Second ground pads 253 are further provided on the second multilayer PCB 20, and the second ground pads 253 are laid on the third grounding conductive layer 251. The first ground pads 143 and the second ground pads 253 are correspondingly superposed and connected by welding.

Further, with reference to FIGS. 4 and 5, there are two or more first ground pads 143, which are arranged at intervals and located on two sides of the first pad 12, respectively.

Further, with reference to FIGS. 4 and 5, there are two or more second ground pads 253, which are arranged at intervals and located on two sides of the second pad 21, respectively. Specifically, two first ground pads 143 are arranged at intervals on one side of the first pad 12, and two first ground pads 143 are also arranged at intervals on the other side thereof. Correspondingly, two second ground pads 253 are arranged at intervals on one side of the second pad 21, and two second ground pads 253 are also arranged at intervals on the other side thereof. The area of the first ground pads 143 and the second ground pads 253 should be as large as possible according to the design requirements to maximize the interconnection area of the ground plane of the first multilayer PCB 10 and the second multilayer PCB 20. In addition, the shape and number of the first ground pads 143 and the second ground pads 253 are not limited to this embodiment. For example, it is possible to use more than four rectangular pads; or, it is possible that the first ground pads 143 on two sides of the first pad 12 and the second ground pads 253 on two sides of the second pad 21 are integrated to form a large ground pad respectively.

In an embodiment, with reference to FIGS. 1-4, first ground holes 192 are further formed on the first multilayer PCB 10, the first ground holes 192 run from the first ground pad 143 to the bottom circuit layer 13 of the first multilayer PCB 10, and conductive layers on sidewalls of the first ground holes 192 are electrically connected to the grounding conductive layers of the first multilayer PCB 10.

In an embodiment, with reference to FIGS. 5 and 6, second ground holes 281 are further formed on the second multilayer PCB 20, the second ground holes 281 run from the second ground pad 253 to the top circuit layer 294 of the second multilayer PCB 20, and conductive layers on sidewalls of the second ground holes 281 are electrically connected to the grounding conductive layers of the second multilayer PCB 20.

Specifically, there are two or more first ground holes 192 and two or more second ground holes 281. Thus, the interconnection of the grounding conductive layers in the layers of the first multilayer PCB 10 and the interconnection of the grounding conductive layers in the layers of the second multilayer PCB 20 can be better realized. In addition, for a high-frequency signal, by adding the first ground holes 192 and the second ground holes 281, the signals flow back nearby, so that the inductive effect can be reduced and a better signal quality can be achieved.

In an embodiment, with reference to FIGS. 1-4, one or more third ground holes 193 are further formed on the first multilayer PCB 10, the third ground holes run from the first grounding conductive layer 131 to the top circuit layer 14 of the first multilayer PCB 10, conductive layers on sidewalls of the third ground holes 193 are electrically connected to the grounding conductive layers of the first multilayer PCB 10, and the third ground holes 193 are arranged at intervals in the arrangement direction of the signal transmission line 11. Thus, the first grounding conductive layer 131 wraps the signal transmission line 11, and the third ground holes 193 (the specific number and position are determined according to the design) are arranged around the signal transmission line 11, so that the high order mode transmission of the millimeter-wave transmission line can be effectively avoided and the performance of the signal transmission line 11 can be improved.

In an embodiment, with reference to FIGS. 5 and 6, one or more fourth ground holes 282 are further formed on the second multilayer PCB 20, the fourth ground holes 282 run from the third grounding conductive layer 251 to the top circuit layer 294 of the second multilayer PCB 20, conductive layers on sidewalls of the fourth ground holes 282 are electrically connected to the grounding conductive layers of the second multilayer PCB 20, and the fourth ground holes 282 are arranged at intervals in the arrangement direction of the impedance matching transformation branch 22. Thus, the third grounding conductive layer 251 wraps the impedance matching transformation branch 22, and the fourth ground holes 282 (the specific number and position are determined according to the design) are arranged around the impedance matching transformation branch 22, so that the high order mode transmission of the millimeter-wave transmission line can be effectively avoided and the performance of the impedance matching transformation branch 22 can be improved.

In an embodiment, two or more third ground holes 193 are formed at intervals on each of two sides of the signal transmission line 11, and two or more ground holes 282 are formed at intervals on each of two sides of the impedance matching transformation branch 22.

In an embodiment, with reference to FIG. 1 again, two or more inner circuit layers 26 are provided on the second multilayer PCB 20. The second multilayer PCB 20 further includes a third dielectric layer 291 arranged between the bottom circuit layer 25 and the inner circuit layer 26 of the second multilayer PCB 20, a fourth dielectric layer 292 arranged between adjacent inner circuit layers 26 of the second multilayer PCB 20, and a fifth dielectric layer 293 arranged between the top circuit layer 294 and the inner circuit layer 26 of the second multilayer PCB 20. The third dielectric layer 291 and the fifth dielectric layer 293 are high-frequency dielectric layers, and the fourth dielectric layer 292 is an RF4 dielectric layer. The high-frequency dielectric layer can be specifically Rogers4350, Rogers5880 or the like, and the second dielectric layer 18 is made of a less-expensive RF4 plate. The layers are superposed by a mixed pressure stacking process, so that the material cost of the second multilayer PCB 20 can be reduced.

In the case of satisfying the weldability, the first pad 12 is as small as possible, so that the difficulty in matching design is reduced. In this embodiment, the size of the first pad 12 is specifically 1 mm*2 mm.

Further, the length and width of the impedance matching transformation branch 22 can be determined according to the electromagnetic simulation. In this embodiment, the size of the impedance matching transformation branch 22 is specifically 1.95 mm*0.5 mm. In addition, the impedance of the impedance line 23 can be determined according to electromagnetic simulation, and is specifically 50 Ohm in this embodiment. As an alternative, the impedance matching transformation branch 22 may also be step-shaped (i.e., multi-step impedance, which is suitable for matching in a wider frequency band) or in a shape with a gradually changed width (i.e., Chebyshev transition matching).

Figure 7:
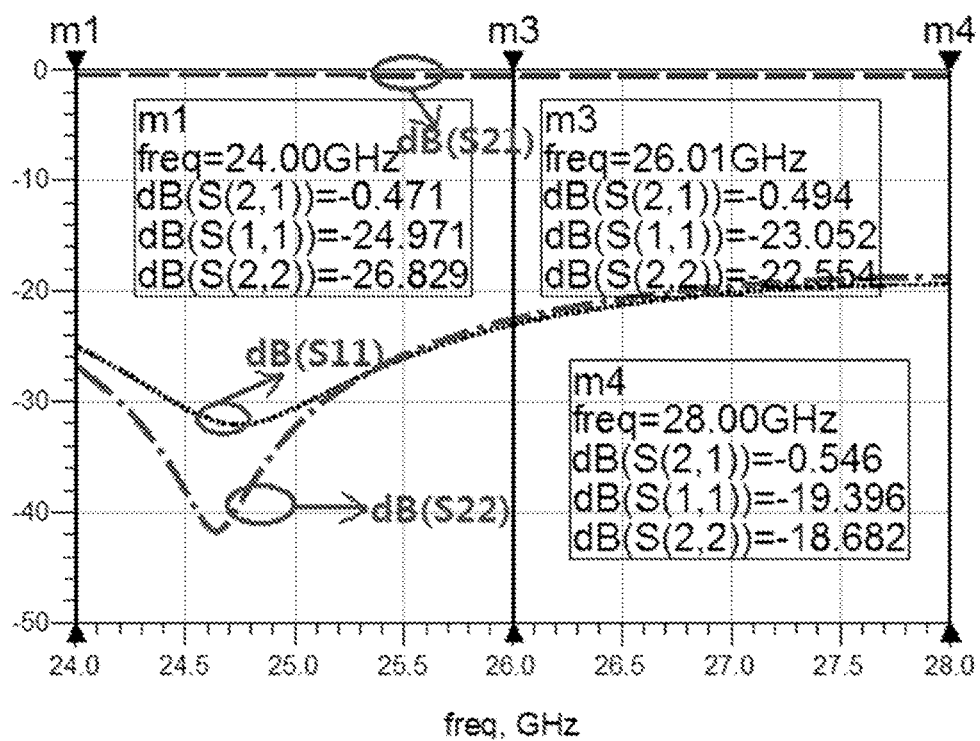
FIG. 7 is a graph of three-dimensional electromagnetic simulation scattering parameters of the interconnection structure between PCBs according to an embodiment of the present application.

With reference to FIG. 7, FIG. 7 is a result diagram of electromagnetic simulation according to an embodiment of the present application. According to the simulation, in a frequency range of 24 GHz to 28 GHz, the insertion loss of the interconnection structure of the first multilayer PCB 10 and the second multilayer PCB 20 is less than 0.6 dB, and the return loss is less than −18 dB, so that high performance of the interconnection structure between different planes of the first multilayer PCB 10 and the second multilayer PCB 20 are realized.

In an embodiment, a millimeter-wave active antenna unit is provided, including the interconnection structure between PCBs according to any one of the above embodiments.

Since the millimeter-wave active antenna unit includes the interconnection structure between PCB s described above, the technical effects of the millimeter-wave active antenna unit are brought by the interconnection structure between PCB s, and the millimeter-wave active antenna unit has the same beneficial effects as the interconnection structure between PCBs and it will not be repeated here.

The foregoing embodiments merely represent several implementations of the present application. Although these embodiments are described specifically and in detail, they shall not be interpreted as limiting the patent scope of the present application. It should be pointed out that, a person of ordinary skill in the art can make several variations and improvements without departing from the concept of the present application, and these variations and improvements shall fall into the protection scope of the present application. Therefore, the protection scope of the present application should be subject to the appended claims.

What is claimed is:

1. An interconnection structure between PCBs, comprising:
a mainboard which is a first multilayer PCB, a signal transmission line and a first pad electrically connected to the signal transmission line being provided on the first multilayer PCB; and
an AIP antenna module which is a second multilayer PCB, a second pad, an impedance matching transformation branch, an impedance line and a signal processing circuit being provided on the second multilayer PCB, the second pad and the first pad being superposed and connected by welding, the second pad being electrically connected to the impedance line through the impedance matching transformation branch, the impedance line being electrically connected to the signal processing circuit;
wherein the bottom circuit layer of the first multilayer PCB comprises a first grounding conductive layer, with a first gap region being provided in the first grounding conductive layer, the signal transmission line being located within the first gap region, and an outer edge of the signal transmission line being spaced apart from an inner edge of the first gap region;
the top circuit layer of the first multilayer PCB comprises a second grounding conductive layer, with a second gap region being provided in the second grounding conductive layer, the first pad being located within the second pad region, and an outer edge of the first pad being spaced apart from an inner edge of the second gap region; and
the bottom circuit layer of the second multilayer PCB comprises a third grounding conductive layer, with a third gap region being provided in the third grounding conductive layer, the second pad, the impedance matching transformation branch and the impedance line being all located within the third gap region, and outer edges of the second pad, the impedance matching transformation branch and the impedance line being spaced apart from an inner edge of the third gap region respectively.

2. The interconnection structure between PCBs according to claim 1, wherein the signal transmission line and the first pad are located on a bottom circuit layer and a top circuit layer of the first multilayer PCB, respectively; a first signal hole running from the first pad to the signal transmission line is formed on the first multilayer PCB; and, the signal transmission line is electrically connected to the first pad through a conductive layer on a sidewall of the first signal hole.

3. The interconnection structure between PCBs according to claim 1, wherein the first multilayer PCB further comprises one or more inner circuit layers arranged between the bottom circuit layer and the top circuit layer of the first multilayer PCB, and a first anti-pad gap region around the first signal hole is provided in the inner circuit layer of the first multilayer PCB.

4. The interconnection structure between PCBs according to claim 3, wherein the first multilayer PCB further comprises a first dielectric layer arranged between the bottom circuit layer and the inner circuit layer of the first multilayer PCB and a second dielectric layer arranged between the top circuit layer and the inner circuit layer of the first multilayer PCB, the first dielectric layer is a high-frequency dielectric layer, and the second dielectric layer is an RF4 dielectric layer.

5. The interconnection structure between PCBs according to claim 4, wherein a partial region of the first multilayer PCB is superposed with a partial region of the second multilayer PCB to define a superposed region; the superposed region of the first multilayer PCB overlapped with the second multilayer PCB comprises a first superposed region and a second superposed region connected to the first superposed region; the first superposed region is closer to an edge of the first multilayer PCB than the second superposed region; the first pad is located within the second superposed region;
the second pad is located at an end of the second multilayer PCB and arranged corresponding to the second superposed region; and, a hollow gap is formed at a position of the first superposed region corresponding to the impedance matching transformation branch.

6. The interconnection structure between PCBs according to claim 5, wherein the first multilayer PCB further comprises a third superposed region connected to the second superposed region, one part of the first pad is located in the second superposed region, and the other part of the first pad is located in the third superposed region.

7. The interconnection structure according to claim 6, wherein an auxiliary welding hole corresponding to the position of the second pad is formed at an end of the second multilayer PCB, the auxiliary welding hole runs from the top layer of the second multilayer PCB to the second pad, and an auxiliary welding conductive layer is provided on a sidewall of the auxiliary welding hole.

8. The interconnection structure between PCBs according to claim 7, wherein an inner circuit layer is provided on the second multilayer PCB, a second anti-pad gap region around the auxiliary welding hole is provided in the inner circuit layer of the second multilayer PCB, and an auxiliary pad electrically connected to the auxiliary welding conductive layer is provided in the second anti-pad gap region.

9. The interconnection structure between PCBs according to claim 1, wherein first ground pads are further provided on the first multilayer PCB, and the first ground pads are laid on the second grounding conductive layer; second ground pads are further provided on the second multilayer PCB, and the second ground pads are laid on the third grounding conductive layer; and, the first ground pads and the second ground pads are correspondingly superposed and connected by welding.

10. The interconnection structure between PCBs according to claim 9, wherein there are two or more first ground pads, which are arranged at intervals and located on two sides of the first pad, respectively; and, there are two or more second ground pads, which are arranged at intervals and located on two sides of the second pad, respectively.

11. The interconnection structure between PCBs according to claim 9, wherein first ground holes are further formed on the first multilayer PCB, the first ground holes run from the first ground pad to the top circuit layer of the first multilayer PCB, and conductive layers on sidewalls of the first ground holes are electrically connected to the grounding conductive layers of the first multilayer PCB respectively; and
second ground holes are further formed on the second multilayer PCB, the second ground holes run from the second ground pad to the top circuit layer of the second multilayer PCB, and conductive layers on sidewalls of the second ground holes are electrically connected to the grounding conductive layers of the second multilayer PCB respectively.

12. The interconnection structure between PCB s according to claim 1, wherein one or more third ground holes are further formed on the first multilayer PCB, the third ground holes run from the first grounding conductive layer to the bottom circuit layer of the first multilayer PCB, conductive layers on sidewalls of the third ground holes are electrically connected to the grounding conductive layers of the first multilayer PCB respectively, and the third ground holes are arranged at intervals in the arrangement direction of the signal transmission line; and more than one fourth ground hole is further formed on the second multilayer PCB, the fourth ground holes run from the third grounding conductive layer to the top circuit layer of the second multilayer PCB, conductive layers on sidewalls of the fourth ground holes are electrically connected to the grounding conductive layers of the second multilayer PCB respectively, and the fourth ground holes are arranged at intervals in the arrangement direction of the impedance matching transformation branch.

13. The interconnection structure between PCBs according to claim 12, wherein two or more third ground holes are formed at intervals on each of two sides of the signal transmission line, and two or more fourth ground holes are formed at intervals on each of two sides of the impedance matching transformation branch.

14. The interconnection structure between PCB s according to claim 1, wherein two or more inner circuit layers are provided on the second multilayer PCB; the second multilayer PCB further comprises a third dielectric layer arranged between the bottom circuit layer and the inner circuit layer of the second multilayer PCB, a fourth dielectric layer arranged between adjacent inner circuit layers of the second multilayer PCB, and a fifth dielectric layer arranged between the top layer circuit layer and the inner circuit layer of the second multilayer PCB; the third dielectric layer and the fifth dielectric layer are high-frequency dielectric layers; and, the fourth dielectric layer is an RF4 dielectric layer.

15. A millimeter-wave active antenna unit, comprising the interconnection structure between PCB s according to claim 1.

\* \* \* \* \*